United States Patent [19]
Tsukamoto et al.

[11] Patent Number: 6,066,950
[45] Date of Patent: May 23, 2000

[54] MR IMAGING METHOD AND APPARATUS

[75] Inventors: Tetsuji Tsukamoto; Koichi Oshio, both of Tokyo, Japan

[73] Assignee: GE Yokogawa Medical Systems, Limited, Tokyo, Japan

[21] Appl. No.: 09/170,176

[22] Filed: Oct. 13, 1998

[30] Foreign Application Priority Data

Nov. 12, 1997 [JP] Japan ................................. 9-310102

[51] Int. Cl.$^7$ ....................................... G01V 3/00
[52] U.S. Cl. ...................... 324/309; 324/318; 128/653.2; 600/419
[58] Field of Search ...................... 324/309, 306, 324/303, 300, 318, 322; 128/653.2, 653.3, 653.4; 600/419

[56] References Cited

FOREIGN PATENT DOCUMENTS 4-108427  4/1992  Japan .

OTHER PUBLICATIONS

"Line Scan diffusion imaging" by Hakon Gudbjartsson, et al, MRM 36: pp. 509–519, 1996.

*Primary Examiner*—Christine K. Oda
*Assistant Examiner*—Brij B. Shrivastav
*Attorney, Agent, or Firm*—Moonray Kojima

[57] ABSTRACT

In order to shorten imaging time in MR imaging, when a partial region A1 is imaged using a fast pulse sequence, a selectively excited region E90 and a selectively inverted region E180 are intersected with each other so as not to include a partial region A2 to be imaged next within the selectively excited region E90 and the selectively inverted region E180.

7 Claims, 8 Drawing Sheets

100 MRI apparatus

Imaging region

Partial region

Signal intensity profile combine profile

MR IMAGING METHOD AND APPARATUS

BACKGROUND OF THE INVENTION

The present invention relates to an MR (Magnetic Resonance) imaging method and apparatus which can shorten the imaging time, provide efficient data acquisition and image a single slice.

Related prior art includes the techniques disclosed in Japanese Patent Application Laid Open No. 4-108427 (1992) and the article entitled "Line Scan Diffusion Imaging", Mag. Res. Med., 36:509–519 (1996).

However, the technique disclosed in Japanese Patent Application Laid Open No. 4-108427 has the following problems: (a) Because a slice plane is selectively inverted, a sufficient time interval for spin relaxation must be secured after a particular partial region is imaged and before a next partial region is imaged, and the total imaging time is lengthened; (b) Only the MR data of the central portion within a partial region is used and the MR data of the peripheral portion is discarded, preventing efficient data acquisition; and (c) This technique is available only when simultaneous imaging of multiple slices is performed and cannot be applied when a single slice is desired to be imaged.

In the technique disclosed in Mag. Res. Med., 36:509–519, so-called "line scanning" is performed, which requires line scanning to be repeated a number of times equal to the number of pixels along the direction orthogonal to the line scanning direction in order to acquire MR data throughout a slice plane, resulting in the long total imaging time especially when the higher resolution is needed.

SUMMARY OF THE INVENTION

It is an object of the present invention to provide an MR imaging method and apparatus which can shorten the imaging time, provide efficient data acquisition and image a single imaging region (slice).

In accordance with a first aspect, the present invention provides an MR imaging method comprising the steps of: dividing an imaging region into a plurality of partial regions each of which can be imaged by one fast imaging sequence; selectively exciting one of the partial regions to be imaged by the fast imaging sequence so that the one of the partial regions is included within a selectively excited region and the selective excitation is performed at a first angle formed as intersecting the imaging region; selectively inverting the one of the partial regions so that the main portion of the one of the partial regions is included within a selectively inverted region and the selective inversion is performed at a second angle having an inclination different from that of the first angle and formed as intersecting the imaging region; obtaining an MR image of substantially all of the imaging region by performing the selective excitation and the selective inversion in the predetermined order for each of the divided partial regions and imaging each of the partial regions by the fast imaging sequence.

According to the MR imaging method of the first aspect, since the selective excitation and the selective inversion are performed at angles formed as intersecting the imaging region, when one partial region is imaged, only the partial region is selectively excited and selectively inverted and the other partial regions are not selectively excited nor selectively inverted. Therefore, no need arises to secure a sufficient time interval for spin relaxation, and after a particular partial region is imaged, the next imaging region can be imaged immediately. Thus the total imaging time can be shortened. Moreover, imaging of a single imaging region (slice) is possible.

In accordance with a second aspect, the present invention provides the MR imaging method as described regarding the first aspect, wherein: the step of dividing the imaging region into the partial regions includes dividing the imaging region so that portions of adjacent partial regions are overlapped, and producing an MR image by adding the overlapped portions together.

According to the MR imaging method of the first aspect, the partial region has a diamond shape in cross section and a triangle shape in signal intensity distribution as viewed along the direction of succession of the partial regions. Accordingly, in the MR imaging method of the second aspect, the adjacent partial regions are overlapped and the overlapped portions are added together. Then the hypotenuses of the triangles of the partial region's signal intensity distributions are overlapped with each other and added together, resulting in flat signal intensity distribution by properly adjusting the overlap of the partial regions. Therefore, no MR data is discarded and the efficiency of MR data acquisition is improved.

In accordance with a third aspect, the present invention provides an MR imaging apparatus comprising: imaging means for performing imaging by a fast imaging sequence which divides an imaging region into a plurality of partial regions each of which can be imaged by one fast imaging sequence, selectively excites one of the partial regions to be imaged by the fast imaging sequence so that the one of the partial regions is included within a selectively excited region and the selective excitation is performed at a first angle formed as intersecting the imaging region, and then selectively inverts the one of the partial regions so that the one of the partial regions is included within a selectively inverted region and the selective inversion is performed at a second angle having an inclination different from that of the first angle and formed as intersecting the imaging region; MR data acquisition means for acquiring MR data imaged by the imaging means in the predetermined order for each of the partial regions; and MR image producing means for producing an MR image of substantially all of the imaging region from the MR data acquired for each of the partial regions.

According to the MR imaging apparatus of the third aspect, the MR imaging method of the first aspect can be suitably implemented.

In accordance with a fourth aspect, the present invention provides the MR imaging apparatus as described regarding the third aspect, wherein: the imaging means divides the imaging region into the partial regions so that portions of adjacent partial regions are overlapped, and the MR image producing means produces an MR image by adding the overlapped parts together.

According to the MR imaging apparatus of the fourth aspect, the MR imaging method of the second aspect can be suitably implemented.

In accordance with a fifth aspect, the present invention provides the MR imaging apparatus as described regarding the third or fourth aspect, wherein the MR data acquisition means acquires MR data imaged by the imaging means for an imaging region consisting of a plurality of slices.

In accordance with a sixth aspect, the present invention provides the MR imaging apparatus as described regarding the third, fourth or fifth aspect, wherein an imaging region imaged by the imaging means is curved.

In accordance with a seventh aspect, the present invention provides the MR imaging apparatus as described regarding the third, fourth, fifth or sixth aspect, wherein the fast imaging sequence used by the imaging means is a sequence according to the echo planar technique, the fast spin echo technique or the gradient spin echo technique.

In accordance with the MR imaging method and apparatus of the present invention, after a particular partial region is imaged, the next partial region may be imaged immediately, thereby shortening the total imaging time. Moreover, a single imaging region (slice) can be imaged. Furthermore, no MR data is discarded and the efficiency of MR data acquisition is improved.

Further objects and advantages of the present invention will be apparent from the following description of the preferred embodiments of the invention as illustrated in the accompanying drawings.

DETAILED DESCRIPTION OF THE INVENTION

The present invention will now be described in more detail with reference to an embodiment shown in the accompanying drawings.

Figure 1:
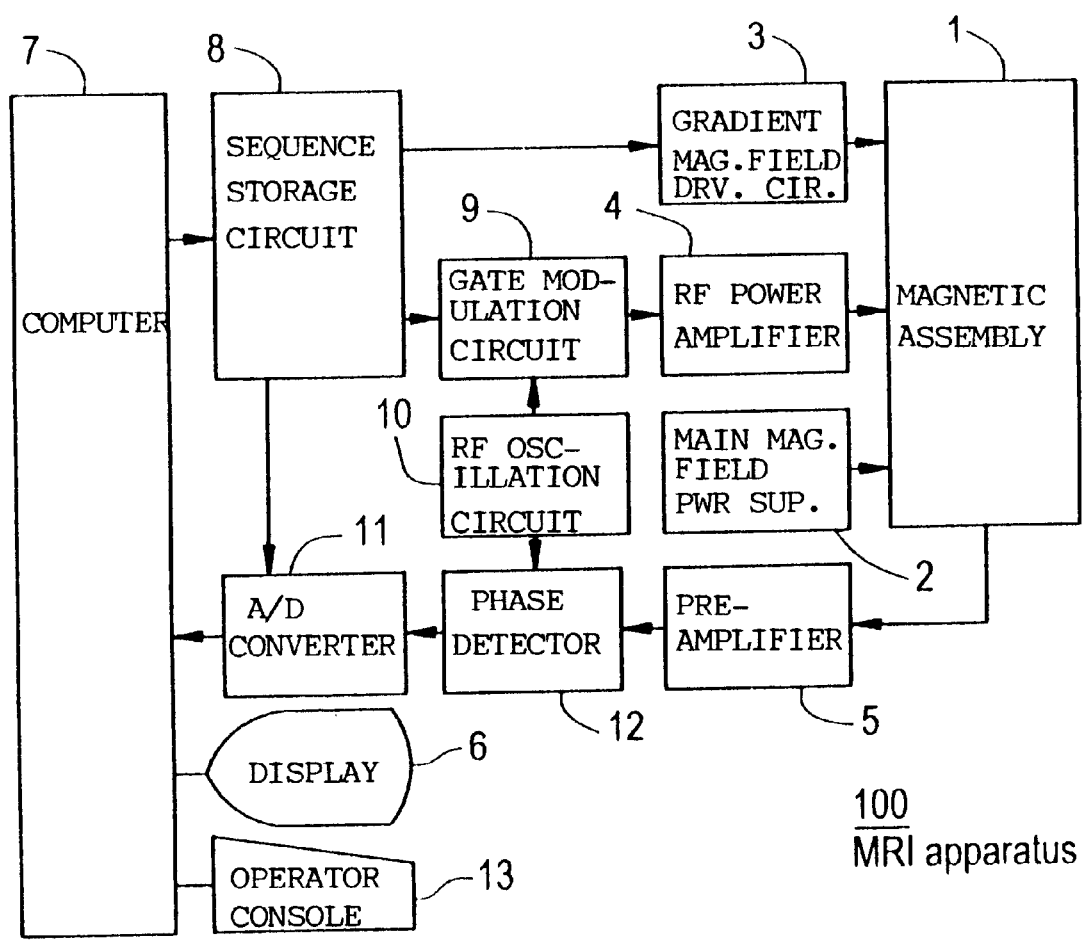
FIG. 1 is a block diagram illustrating an MRI apparatus in accordance with one embodiment of the present invention.

FIG. 1 is a block diagram illustrating an MRI apparatus in accordance with one embodiment of the present invention.

In the MRI apparatus 100, a magnet assembly 1 has a cavity portion (bore) through which a subject is inserted. Surrounding the cavity portion, there are provided a main magnetic field coil which applies a constant main magnetic field to the subject, a gradient magnetic field coil (comprising x-, y-, and z-axis coils, which in combination determine the slice, phase-encoding and read axes) for generating a gradient magnetic field, a transmit coil for transmitting RF pulses which excite the spins of the nuclei within the subject and invert magnetization, and a receive coil which receives NMR signals, from the subject. The main magnetic field coil, the gradient magnetic field coil, the transmit coil and the receive coil are connected respectively to a main magnetic field power supply 2, a gradient magnetic field drive circuit 3, an RF power amplifier 4 and a preamplifier 5.

A computer 7 creates a pulse sequence and forwards it to a sequence memory circuit 8.

The sequence memory circuit 8 stores the pulse sequence, operates the gradient magnetic field drive circuit 3 based on the pulse sequence to generate a gradient magnetic field from the gradient magnetic field coil in the magnet assembly 1, and operates a gate modulation circuit 9 to modulate a carrier output signal from an RF oscillation circuit into a pulsed signal which has a predetermined timing and a predetermined envelope shape. The pulsed signal is applied to the RF power amplifier 4 as the RF pulse, power-amplified by the RF power amplifier 4, and applied to the transmit coil in the magnetic assembly 1.

The preamplifier 5 amplifies the NMR signal received by the receive coil in the magnetic assembly 1 and supplies it to a phase detector 12. The phase detector 12 phase-detects the NMR signal using the carrier output signal from the RF oscillation circuit 10 as a reference signal, and supplies the detected NMR signal to an AID (analog-to-digital) converter 11. The A/D converter 11 converts the analog NMR signal into digital MR data and supplies the digital data to the computer 7.

The computer 7 reads the MR data from the A/D converter 11 and performs an image reconstruction operation to produce an MR image. The MR image is presented on a display 6.

The computer 7 also performs overall control such as receiving information supplied from an operator console 13.

Figure 2:
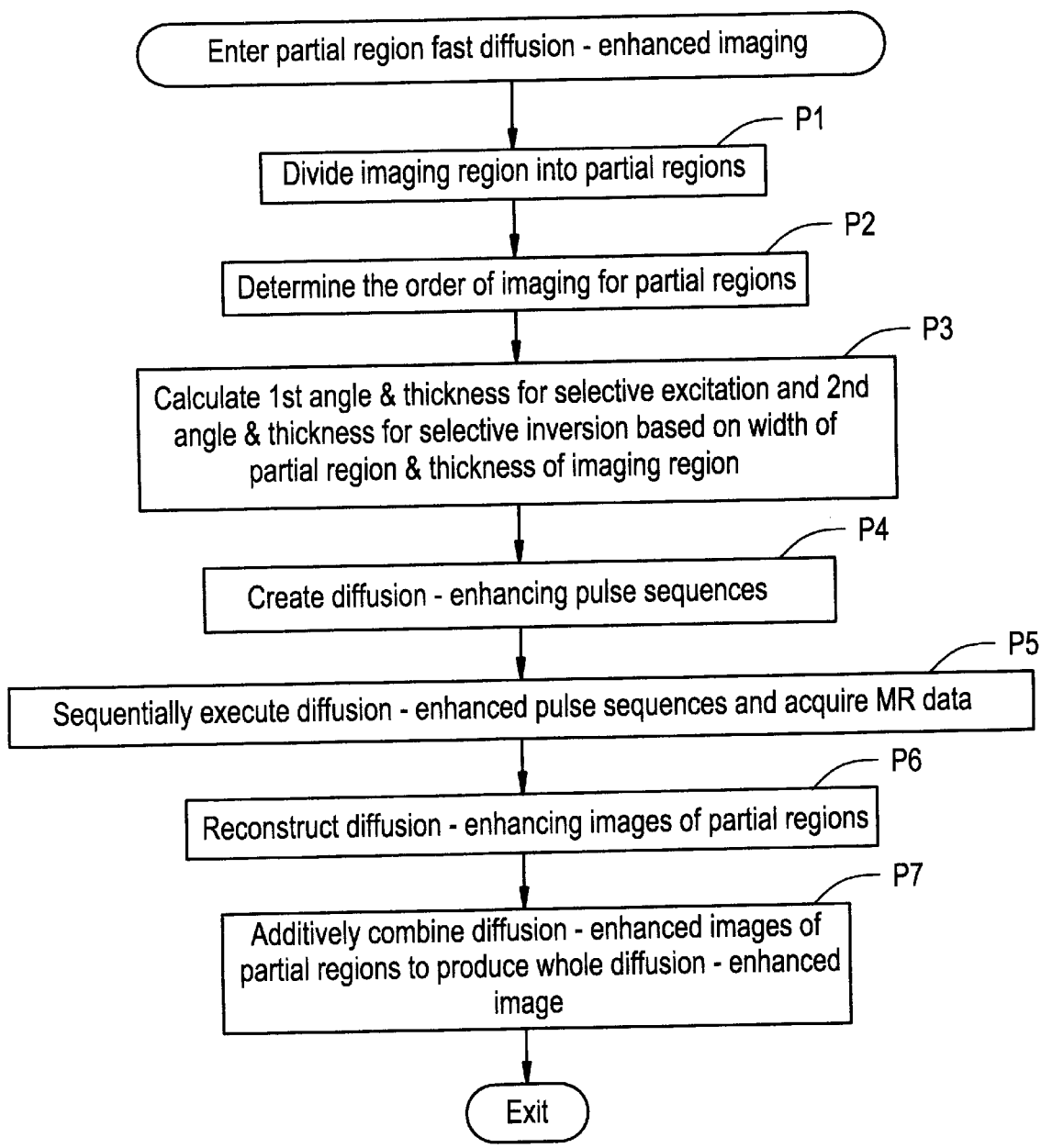
FIG. 2 is a flow chart of a partial region fast diffusion-enhanced imaging process in the MRI apparatus shown in FIG. 1.

FIG. 2 is a flow chart of a partial region fast diffusion-enhanced imaging process in the MRI apparatus 100.

Figure 3:
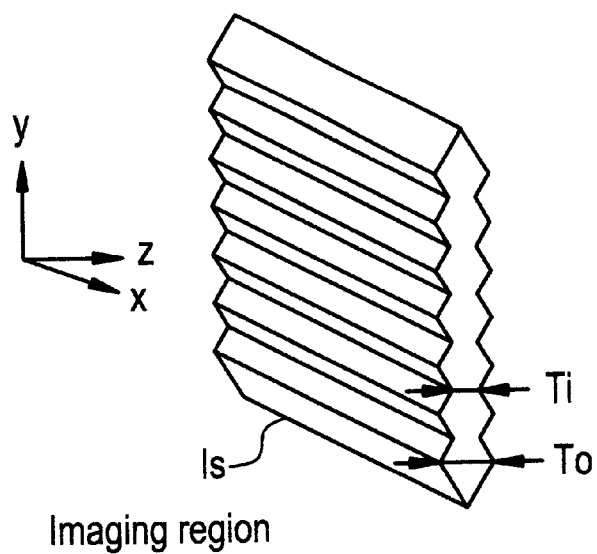
FIG. 3 is a perspective view of an imaging region in accordance with the present invention.
Figure 4:
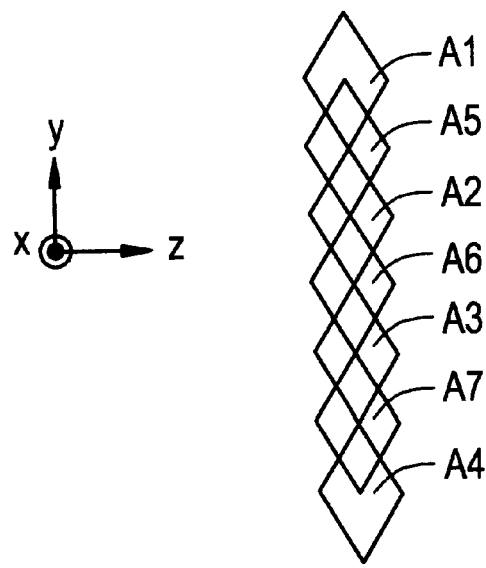
FIG. 4 is an explanatory diagram illustrating partial regions in accordance with the present invention.

In Step P1, an imaging region is divided into a plurality of partial regions each of which can be imaged in one fast imaging sequence (imaging region dividing means). For example, an imaging region Is shown in FIG. 3 is divided into partial regions A1–A7 shown in FIG. 4. In FIG. 3, To is the maximum thickness of the imaging region Is, and Ti is the minimum thickness of the imaging region Is. As shown in FIG. 4, the adjacent partial regions are overlapped by half.

In Step P2, the order of imaging for the partial regions is determined. For example, the order of imaging for the partial regions A1–A7 shown in FIG. 4 is defined such that the partial regions A1–A4 constituting Group 1 which are not overlapped with each other are ordered first–fourth, and the partial regions A5–A7 constituting Group 2 which are not overlapped with each other are ordered fifth–seventh.

Figure 5:
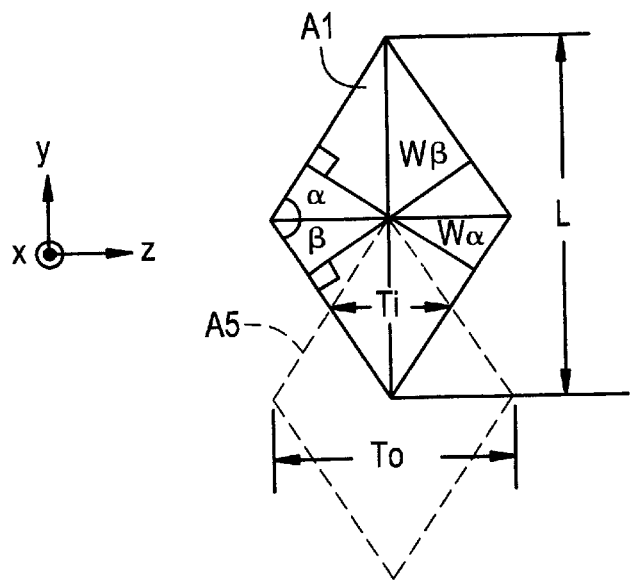
FIG. 5 is an explanatory diagram illustrating the relationship among the width of a partial region, the thickness of the imaging region, the angle and thickness for selective excitation and the angle and thickness for selective inversion.

In Step P3, a first angle and thickness for selective excitation and a second angle and thickness for selective inversion are calculated based on the width of the partial region and the thickness of the imaging region. For example, as shown in FIG. 5, the first angle $\alpha$ and thickness $W\alpha$ for selective excitation and the second angle $\beta$ and thickness Wβ for selective inversion are calculated using the width L of the partial region A1 and the maximum thickness To of the imaging region Is, by the following equations:

$$\alpha = \arctan\{L/To\}, \quad (1)$$

$$W\alpha = |To \cdot \sin\{\alpha\}|, \quad (2)$$

$$\beta = -\arctan\{L/To\}, \quad (3)$$

$$W\beta = |To \cdot \sin\{\beta\}| = W\alpha, \quad (4)$$

If the overlap between the adjacent partial regions is half (i.e. L/2), then $$To = 2 \cdot Ti, \quad (5)$$

and therefore the following equations are obtained by substituting the Eq. (5) into Eqs. (1)–(4):

$$\alpha = \arctan\{L/(2 \cdot Ti)\}, \quad (6)$$

$$W\alpha = |2 \cdot Ti \cdot \sin\{\alpha\}|, \quad (7)$$

$$\beta = -\arctan\{L/(2 \cdot Ti)\}, \quad (8)$$

$$W\beta = |2 \cdot Ti \cdot \sin\{\beta\}| = W\alpha. \quad (9)$$

The first angle α and thickness Wα for selective excitation and the second angle β and thickness Wβ for selective inversion can be thus calculated using the width L of the partial region A1 and the minimum thickness Ti of the imaging region Is.

Figure 6:
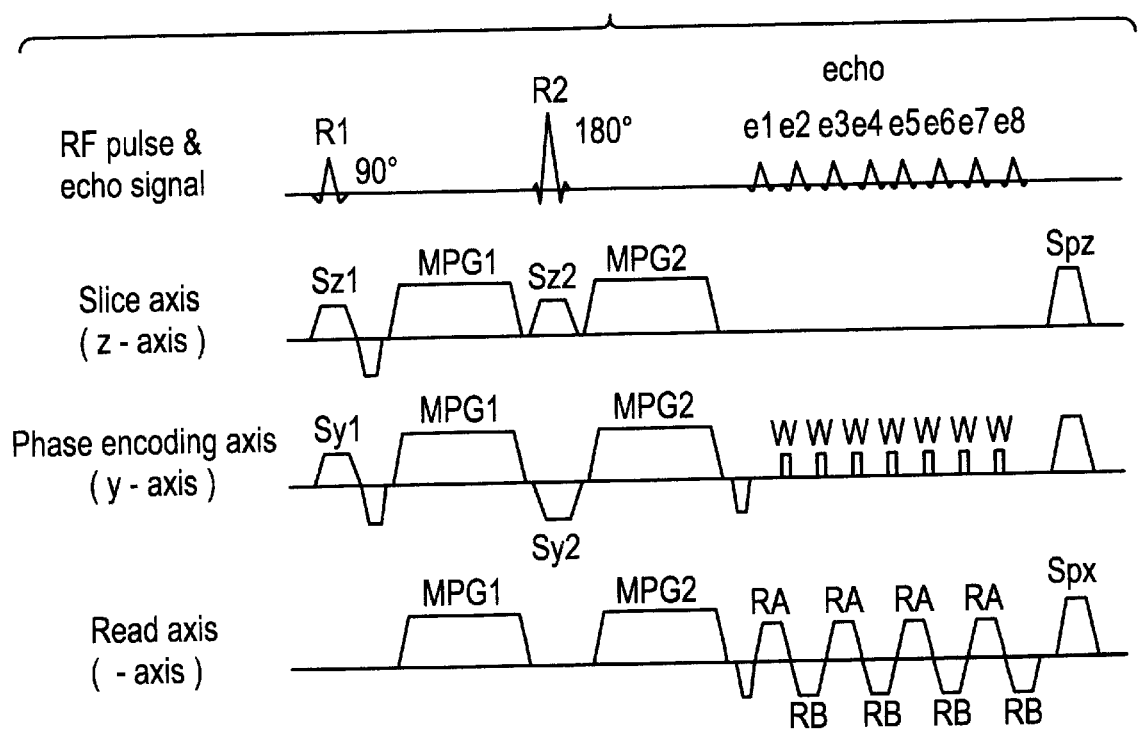
FIG. 6 is a chart of a pulse sequence for partial region fast diffusion enhancement.
Figure 7:
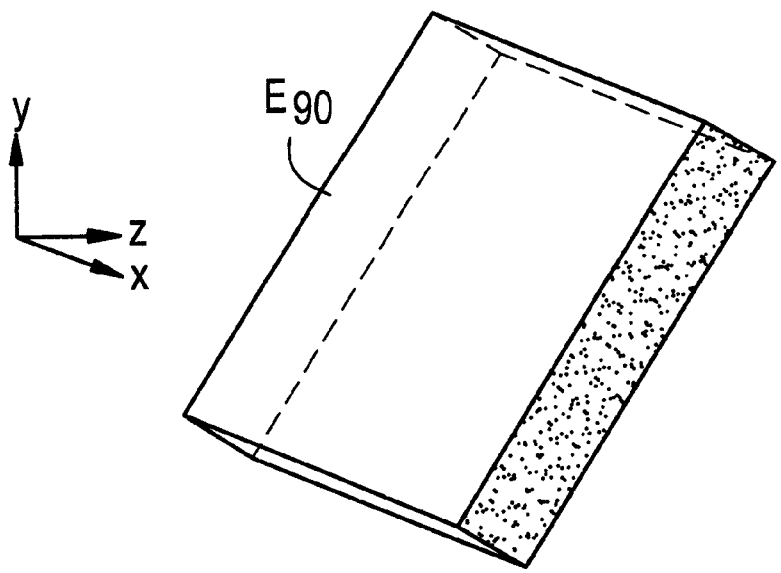
FIG. 7 is an exemplary view of a selectively excited region.
Figure 8:
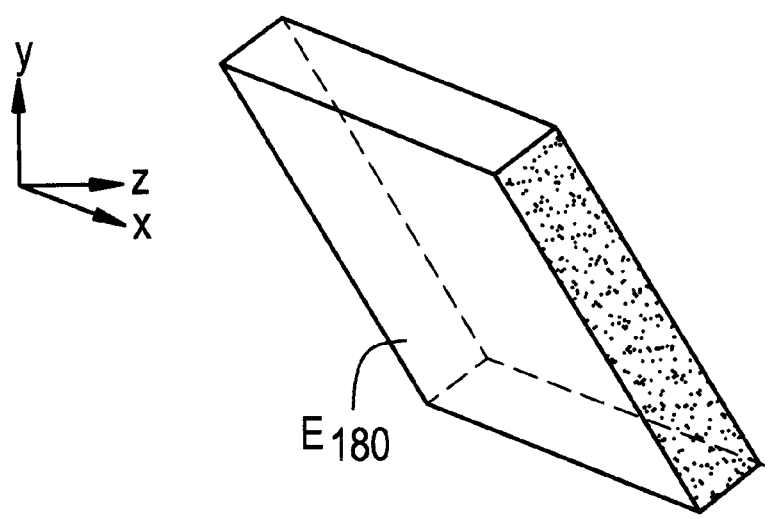
FIG. 8 is an exemplary view of a selectively inverted region.
Figure 9:
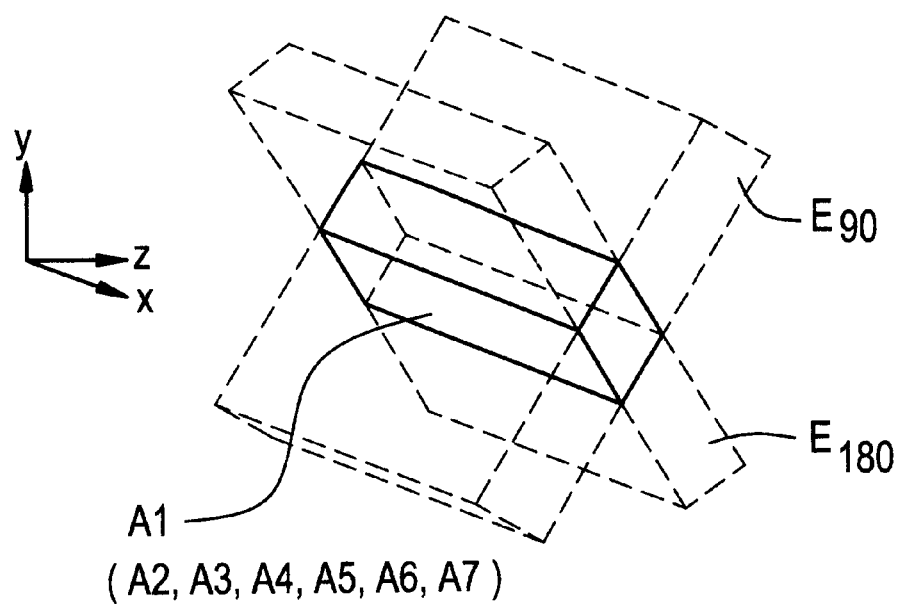
FIG. 9 is a perspective view illustrating the overlap between the selectively excited region and the selectively inverted region.

In Step P4, a partial region fast diffusion-enhancing pulse sequence for each of the partial regions A1–A7 is created. The partial region fast diffusion-enhancing pulse sequence is exemplarily shown in FIG. 6. In the partial region fast diffusion-enhancing pulse sequence, gradient magnetic fields Sz1 and Sy1 are applied respectively to the slice axis (z-axis) and the phase encoding axis (y-axis) simultaneously with an excitation pulse R1 (90°) to selectively excite a region which inclines by, for example, 32° from the +z direction to the +y direction. Although the echo-planar technique is employed for the pulse sequence shown in FIG. 6, fast pulse sequences according to techniques such as Fast SE and GRASE may be employed. A selectively excited region E90 is exemplarily shown in FIG. 7. Next, the diffusion-enhancing gradient MPG1 is applied to an arbitrary axis (or axes). Subsequently, gradient magnetic fields Sz2 and Sy2 are applied respectively to the slice axis (z-axis) and the phase encoding axis (y-axis) simultaneously with an inversion pulse R2 (180°) to selectively invert a region which inclines by, for example, 32° from the +z direction to the −y direction. A selectively inverted region E180 is exemplarily shown in FIG. 8. Accordingly, the echoes are focused only within the partial region A1 (or any one of A2–A7) where the selectively excited region E90 and the selectively inverted region E180 are overlapped with each other, as shown in FIG. 9. Next, the diffusion-enhancing gradient MPG2 is applied to an arbitrary axis (or axes). Subsequently, as positive and negative read gradients RA and RB are alternately and continuously applied and phase encoding gradients Ware applied, the MR data are acquired from the respective focused echoes e1, e2. . .

Figure 10A:
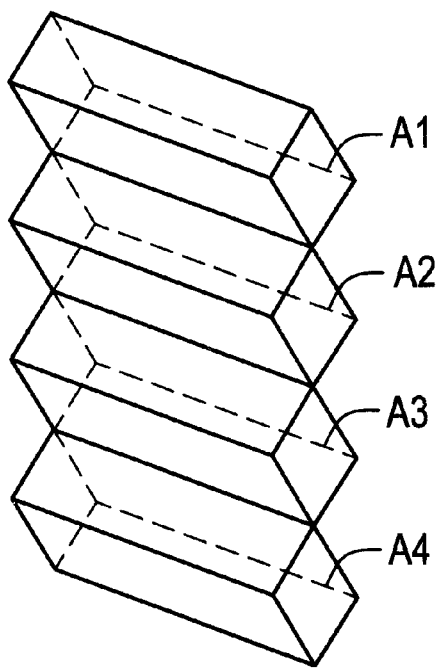
FIG. 10 is a perspective view illustrating the order of imaging for the partial regions.
Figure 10B:
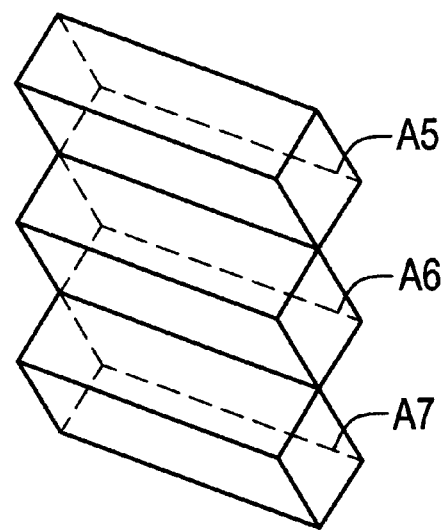

In Step P5, the partial region fast diffusion-enhancing pulse sequences are executed on the partial regions in the order determined in Step P2 (imaging means) to acquire the MR data (MR data acquisition means). For example, the partial regions A1–A4 in Group 1 which are not overlapped with each other are imaged in the order of first–fourth as shown in FIG. 10(a), and then the partial regions A5–A7 in Group 2 which are not overlapped with each other are imaged in the order of fifth–seventh as shown in FIG. 10(b).

Figure 11:
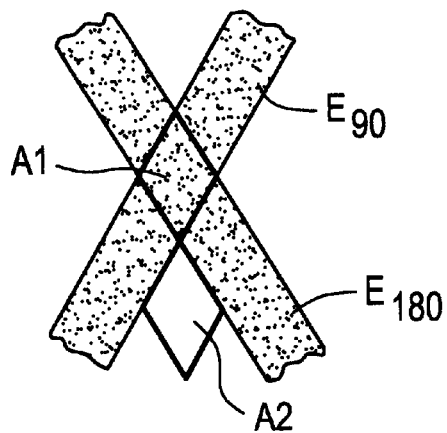
FIG. 11 is an explanatory view showing that the selectively excited region and the selectively inverted region for a particular partial region, and a partial region to be imaged next are not overlapped.

As shown in FIG. 11, since the selectively excited region E90 and the selectively inverted region E180 for a specific partial region (e.g., A1) are not overlapped with the other partial regions (e.g. A2) within un-overlapping Group 1, a sufficient time interval for spin relaxation is not needed and the next partial region may be imaged immediately after the specific partial region is imaged, in the first–fourth region imaging step. However, the regions should be imaged in the spatially continuous order taking the imaging step for Group 2 into account. In the first imaging step for Group 2, since a partial region in Group 2 which is overlapped with a partial region in Group 1 imaged in the furthest past is selected to be imaged, the spins in the partial region have relaxed sufficiently and a sufficient time interval for spin relaxation is again not needed, allowing the next partial region to be imaged immediately. Since for the same reason as explained above, a sufficient time interval is also not needed in the second and later imaging steps for Group 2, quick and successive imaging can be performed.

In Step P6, a diffusion-enhanced image of each partial region is reconstructed (MR image producing means).

Figure 12A:
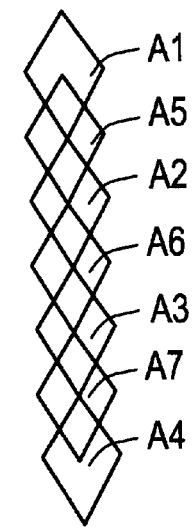
FIG. 12 is an explanatory diagram of a signal intensity profile.
Figure 12B:
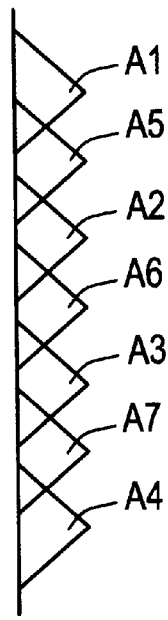
Figure 12C:

In Step P7, the diffusion-enhanced images of the partial regions are additively combined to produce a diffusion-enhanced image of the entire imaging region Is (MR imaging means). For example, the partial regions A1–A7 have a diamond shape in cross section and a triangle shape in signal intensity distribution as viewed along their direction of succession, as shown in FIGS. 12(a) and (b). Accordingly, additively combining them so that the overlapped portions between the adjacent partial regions are summed results in a flat signal intensity distribution as shown in FIG. 12(c).

The above-described MRI apparatus 100 can shorten the imaging time, improve the efficiency in data acquisition, and image a single imaging region (slice).

Figure 13:
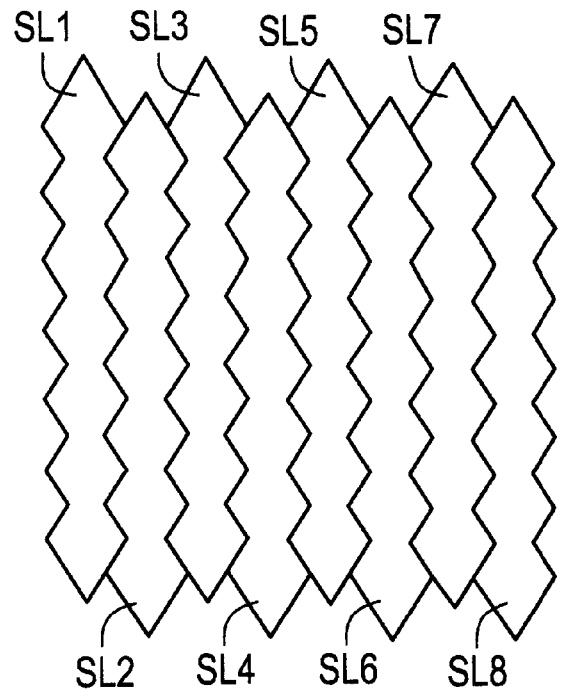
FIG. 13 is an explanatory diagram illustrating application of the present invention to a plurality of continuous imaging regions.

Other embodiments include that shown in FIG. 13, in which, when a plurality of continuous imaging regions SL1, SL2, . . . are to be imaged, the portion having the maximum width To and the portion having the minimum width Ti are disposed engaged with each other between the odd-numbered imaging regions SL1, SL3, . . . and the even-numbered imaging regions SL2, SL4, . . . This embodiment enables three-dimensional imaging without generating a MR data missing portion.

Figure 14:
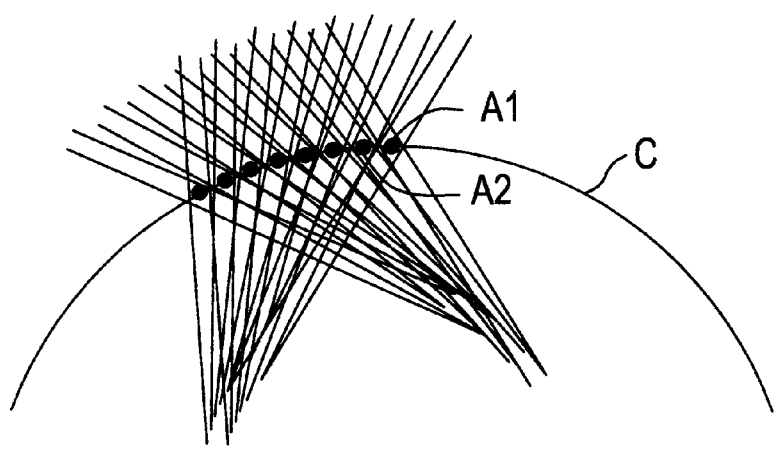
FIG. 14 is an explanatory diagram illustrating application of the present invention to a curved imaging region.

Still another embodiment is shown in FIG. 14, in which the first angle α and the second angle β are rotated gradually according to inclination of the partial regions A1, A2, . . . on a curved imaging region. This embodiment enables a curved imaging region to be imaged. However, since a distance is required so as not to include the partial region to be imaged next within the selectively excited region and the selectively inverted region for a particular partial region, the overlap between the adjacent partial regions is less than half (L/2).

Many widely different embodiments of the invention may be configured without departing from the spirit and the scope of the present invention. It should be understood that the present invention is not limited to the specific embodiments described in the specification, except as defined in the appended claims.

What is claimed is:

1. An MR imaging method comprising the steps of:
dividing an imaging region into a plurality of partial regions each of which can be imaged by one fast imaging sequence;
selectively exciting one of the partial regions to be imaged by the fast imaging sequence so that the one of the partial regions is included within a selectively excited region and the selective excitation is performed at a first angle formed as intersecting the imaging region;

selectively inverting the one of the partial regions so that the main portion of the one of the partial regions is included within a selectively inverted region and the selective inversion is performed at a second angle having an inclination different from that of the first angle and formed as intersecting the imaging region; and obtaining an MR image of substantially all of the imaging region by performing the selective excitation and the selective inversion in the predetermined order for each of the divided partial regions and imaging each of the partial regions by the fast imaging sequence.

2. The MR imaging method of claim 1, wherein: the step of dividing the imaging region into the partial regions includes dividing the imaging region so that portions of adjacent partial regions are overlapped, and producing an MR image by adding the overlapped portions together.

3. An MR imaging apparatus comprising:

imaging means for performing imaging by a fast imaging sequence which divides an imaging region into a plurality of partial regions each of which can be imaged by one fast imaging sequence, selectively excites one of the partial regions to be imaged by the fast imaging sequence so that the one of the partial regions is included within a selectively excited region and the selective excitation is performed at a first angle formed as intersecting the imaging region, and then selectively inverts the one of the partial regions so that the one of the partial regions is included within a selectively inverted region and the selective inversion is performed at a second angle having an inclination different from that of the first angle and formed as intersecting the imaging region;

MR data acquisition means for acquiring MR data imaged by the imaging means in the predetermined order for each of the partial regions; and MR image producing means for producing an MR image of substantially all of the imaging region from the MR data acquired for each of the partial regions.

4. The MR imaging apparatus of claim 3, wherein:

the imaging means divides the imaging region into the partial regions so that portions of adjacent partial regions are overlapped, and the MR image producing means produces an MR image by adding the overlapped parts together.

5. The MR imaging apparatus of claim 3, wherein the MR data acquisition means acquires MR data imaged by the imaging means for an imaging region consisting of a plurality of slices.

6. The MR imaging apparatus of claim 3, wherein an imaging region imaged by the imaging means is curved.

7. The MR imaging apparatus of claim 3, wherein the fast imaging sequence used by the imaging means is a sequence according to the echo planar technique, the fast spin echo technique or the gradient spin echo technique.

* * * * *